(12) United States Patent
Funk et al.

(10) Patent No.: US 6,369,931 B1
(45) Date of Patent: Apr. 9, 2002

(54) METHOD FOR MANUFACTURING A MICROMECHANICAL DEVICE

(75) Inventors: Karsten Funk; Wilhelm Frey, both of Stuttgart (DE)

(73) Assignee: Robert Bosch GmbH, Stuttart (GE)

( * ) Notice: Subject to any disclaimer, the term of this patent is extended or adjusted under 35 U.S.C. 154(b) by 0 days.

(21) Appl. No.: 09/367,760

(22) PCT Filed: Oct. 26, 1998

(86) PCT No.: PCT/DE98/03129

§ 371 Date: Aug. 18, 1999

§ 102(e) Date: Aug. 18, 1999

(87) PCT Pub. No.: WO99/32919

PCT Pub. Date: Jul. 1, 1999

(30) Foreign Application Priority Data

Dec. 22, 1997 (DE) .......................................... 197 57 197

(51) Int. Cl.[7] .............................................. G02B 17/00
(52) U.S. Cl. ...................... 359/223; 359/224; 257/414; 257/415; 216/2; 216/24; 216/58; 216/67
(58) Field of Search ............................... 216/2, 24, 26, 216/58, 67; 359/223, 224, 318; 257/414, 415

(56) References Cited

U.S. PATENT DOCUMENTS

| | | | |
|---|---|---|---|
| 3,886,310 | A | 5/1975 | Guldberg et al. |
| 4,596,992 | A | 6/1986 | Hornbeck |
| 5,444,566 | A | * 8/1995 | Gale et al. .................. 359/291 |

(List continued on next page.)

FOREIGN PATENT DOCUMENTS

| EP | 0 664 470 | 7/1986 |
|---|---|---|
| EP | 0 712 022 | 5/1996 |

OTHER PUBLICATIONS

J. Buehler et al., "Electrostatic Aluminum Micromirrors Using Double–Pass Metallization", Journal of Microelectomechanical Systems, Bd. 6, No. 2, Jun. 1997, pp. 126–134.

L. J. Hornbeck, "Deformable–Mirror Spatial Light Modulators", Spatial Light Modulators and Applications III, San Diego, Bd. 1150, Aug. 7, 1989, pp. 86–102.

J. B. Sampsell, "Digital Micromirror Device and It's Application to Projection Displays", Journal of Vacuum Science and Technology: Part B, Bd. 12, No. 6, Nov. 1, 1994, pp. 3242–3246.

V. P. Jaecklin et al., "Optical Microshutters and Torsional Micromirrors for Light Modulator Arrays", Proc. IEEE Micro Electro Mechanical Systems, Florida, Feb. 1993, pp. 124–127.

K. E. Petersen, "Silicon Torsional Scanning Mirror", IBM Journal of Research and Development, vol. 24, No. 5, Sep. 1980, pp. 631–637.

Primary Examiner—Randy Gulakowski
Assistant Examiner—Jiri Smetana
(74) Attorney, Agent, or Firm—Kenyon & Kenyon

(57) ABSTRACT

A method for manufacturing a micromechanical device, in particular a micromechanical vibrating-mirror device, having the following steps: making available a three-layer structure having a first layer, a second layer and a third layer, the second layer lying between the first and the third layers; etching through the first layer up to the second layer to produce an island region, lying on the second layer, which is joined to region of the first layer surrounding the island region by way of one or more connecting webs, and etching through a region of the third layer up to the second layer and removing a region of the second layer below the island region in such a way that the island region can perform movements, preferably torsional vibrations, about the one or more connecting webs, the torsional vibrations having such an amplitude that a part of the island region extends into the etched-through region of the third layer.

14 Claims, 3 Drawing Sheets

U.S. PATENT DOCUMENTS

| | | | |
|---|---|---|---|
| 5,448,546 A | * 9/1995 | Pauli | 369/112 |
| 5,504,614 A | * 4/1996 | Webb et al. | 359/223 |
| 5,526,951 A | * 6/1996 | Bailey et al. | 216/24 |
| 5,535,047 A | * 7/1996 | Hornbeck | 359/295 |
| 5,552,924 A | * 9/1996 | Tregilgas | 359/224 |
| 5,567,334 A | * 10/1996 | Baker et al. | 216/24 |
| 5,696,619 A | * 12/1997 | Knipe et al. | 359/224 |
| 5,717,513 A | * 2/1998 | Weaver | 359/221 |
| 5,742,419 A | * 4/1998 | Dickensheets et al. | 359/201 |
| 6,028,689 A | * 2/2000 | Michalicek et al. | 359/224 |
| 6,086,776 A | * 7/2000 | Maynard | 216/24 |

\* cited by examiner

METHOD FOR MANUFACTURING A MICROMECHANICAL DEVICE

FIELD OF THE INVENTION

The present invention relates to a manufacturing method for a micromechanical device, in particular for a micromechanical vibrating mirror.

BACKGROUND INFORMATION

Although applicable to any micromechanical devices, the present invention and the objective underlying it are clarified with reference to a micromechanical vibrating mirror.

Several design variations exist for micromechanical vibrating mirrors. For example, an aluminum membrane can be deflected by electrostatic forces, as is described in Texas Instruments, L. J. Hornbeck, Proc. Soc. Photo-Opt. Instrum. Eng. 1150 (1989) 86; J. Bühler et al. J. MEMS 6 (1997) 126.

Several publications describe movable mirrors made of monocrystalline silicon (IBM, K. E. Petersen, IBM J. Res. Develop. 24 (1980) 631) or of polysilicon (CSEM, V. P. Jaecklin et al., Proc. IEEE Micro Electro Mech. System Workshop, FL, USA (1993) 124).

The problem on which the present invention is based is that these concepts, above all in the case of large mirrors having lateral dimensions in the range of a few 100 $\mu$m, allow only small angular deflections in the range of a few degrees, which can be attributed to the limited, maximum possible edge deflection. In the case of surface-micromechanical concepts, the edge deflection is limited by the small substrate clearance of a few micrometers, while in the case of bulk-micromechanical components, the thick torsion-spring suspension mounts permit only relatively small torsion angles, even given large drive voltages, or manufacturing tolerances give rise to substantial variations in the mirror properties.

SUMMARY OF THE INVENTION

Compared to the known design-approach starting points, the manufacturing method of the present invention, has the advantage that large deflection angles can be achieved without making the process technology more complicated.

According to the present invention a micromechanical device, in particular a resonant vibrating-mirror device made of silicon, is flexibly suspended on connecting webs, preferably long bars made of silicon, in such a way that it can turn about its longitudinal axis. Underneath the resonant vibrating-mirror device, the bulk material is completely removed, i.e., the wafer is locally perforated, so that the device can perform torsional vibrations about the connecting webs, the torsional vibrations having such an amplitude that a part of the device extends into the region of the removed bulk material.

In the case of a resonant vibrating-mirror device, the reflecting surface of the mirror is used simultaneously as an actuator for adjusting the mirror. A counter-electrode, placed under the mirror by aligned counter-bonding, for example, forms a capacitor with the mirror surface. The mirror element is deflected by applying an electric voltage. The device can be operated at ambient pressure, since because of the great distance between the mirror and counter-bonded driving electrodes, there is only a relatively small air friction. If the mechanical resonance of the mirror element is excited by the actuators, the deflection of the actuator attainable due to the electrostatic forces is enhanced by the factor of the mechanical quality.

According to a another embodiment of the present invention, first the region of the third layer is etched through, then the first layer is etched through, and thereupon the region of the second layer is removed.

According to another embodiment of the present invention, the region of the third layer is etched through by anisotropic etching of the back surface. Deep patterns can be etched into silicon inexpensively using established wet etch techniques such as KOH, TMAH. The necessity of compensation structures for protecting convex corners has an effect on the patterning.

According to a another embodiment of the present invention, the first layer is etched through by a dry etching process. Only micromechanical spring suspensions having lateral dimensions of >100 $\mu$m can be implemented in a controlled manner using wet etch techniques. In contrast, in surface micromechanics, any patterns as desired having lateral dimensions of 10 $\mu$m and less with substantial aspect ratios can be etched vertically into the substrate by dry etching processes (plasma trenching). However, deep etching >100 $\mu$m is not actually practical for reasons of cost.

The method of the present invention for manufacturing a micro-mirror with large deflection angles is preferably composed of a combination of laterally high-resolution dry etching of the mirror structure on one hand, and the customary deep etching of the back-surface structure on the other hand.

According to another embodiment of the present invention, first of all the first layer is etched through, and after that the region of the second layer is removed and the region of the third layer is etched through.

Yet another embodiment of the present invention provides for etching through the region of the third layer by anodic etching of the back surface to make the region of the third layer porous, and subsequently removing the region which has been made porous. In this case, no protection (protective layer or etching dosage) is necessary on the front side; rather, only a mask made, for example, of gold or chromium/gold or $SiO_2$+Cr+Ai, etc., is necessary on the back surface. In the case of large elements, the surface consumption for (100)-standard-wafers is perceptively reduced compared to KOH-etched backside cavities.

In another embodiment of the present invention, the region of the second layer is directly removed in the anodizing electrolyte. No additional etching of the middle second layer, e.g., sacrificial oxide etching, is necessary, because the second layer, e.g., the oxide, is etched by the anodizing electrolyte. The anodization is not critical in semi-conductor production; no KOH and no NaOH, etc., are used, but rather CMOS-compatible process liquids such as hydrofluoric acid and DI water a deionized water.

According to another embodiment of the present invention, the counter-electrodes are applied on a base, and the base is bonded to the third layer in such a way that the counter-electrodes lie essentially opposite the island region. In this context, the counter-electrodes for the capacitive driving of the mirror are expediently counter-bonded on suitable insulating material.

In another embodiment of the present invention, an SOI (i.e., silicon-on-insulator) structure having an SOI layer, which is provided on a silicon substrate layer with the interposition of an insulating layer, is supplied as the three-layer structure. This is a customary standard structure in micromechanics.

Another embodiment of the present invention provides for using narrow regions of the first layer as connecting webs which are formed by the etching process using a suitable mask geometry. In the case of the vibrating-mirror device, they can be used as torsion springs.

According to still another embodiment of the present invention, narrow regions of a preferably metallic additional layer are used as connecting webs. In the case of the vibrating-mirror device, these can be used as torsion springs. In the implementation of other devices, the connecting webs can also be used as bearing elements.

DETAILED DESCRIPTION.

FIG. 1a–1e show a cross-sectional representation of the process steps according to a first embodiment of the method of the present invention for manufacturing a vibrating mirror.

Figure 1A:
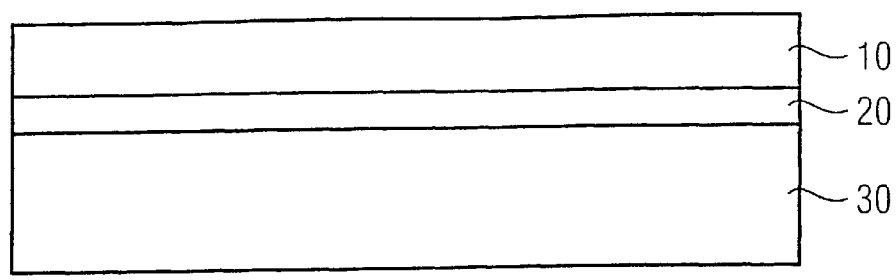
FIG. 1a shows a cross-sectional representation of a first process step of a first embodiment of the method of the present invention for manufacturing a vibrating mirror.

FIG. 1a shows an SOI wafer structure having an SOI layer 10 which is provided on a silicon substrate layer 30, with the interposition of an insulating layer 20 (e.g., an oxide layer).

Figure 1B:
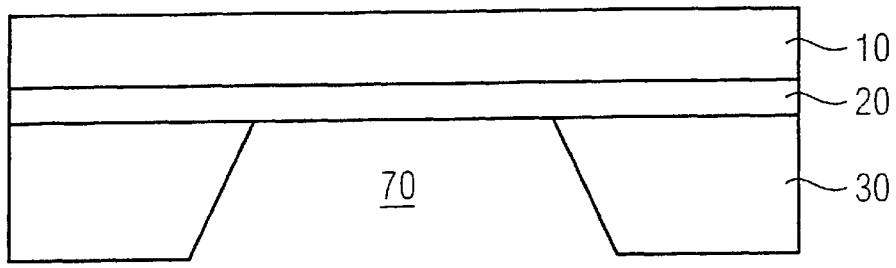
FIG. 1b shows a cross-sectional representation of a second process step of the first embodiment.

According to FIG. 1b, silicon substrate layer 30 is etched through up to insulating layer 20 by wet etching. This is advantageously done with TMAH, KOH, and is carried out with an SOI wafer that is protected from etching on the front side and is masked on the back surface for producing a cavity region 70.

Figure 1C:
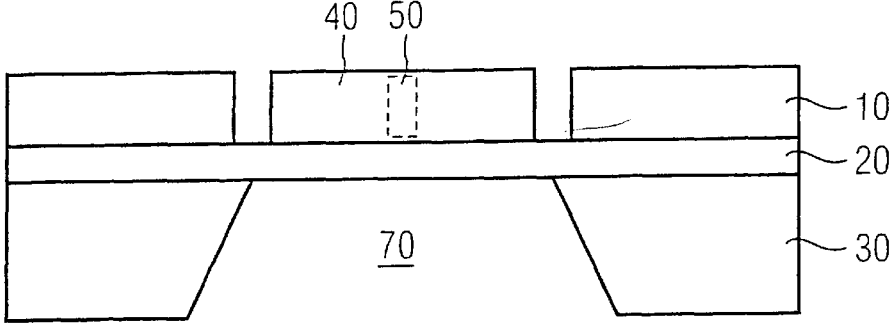
FIG. 1c shows a cross-sectional representation of a third process step of the first embodiment.
Figure 3:
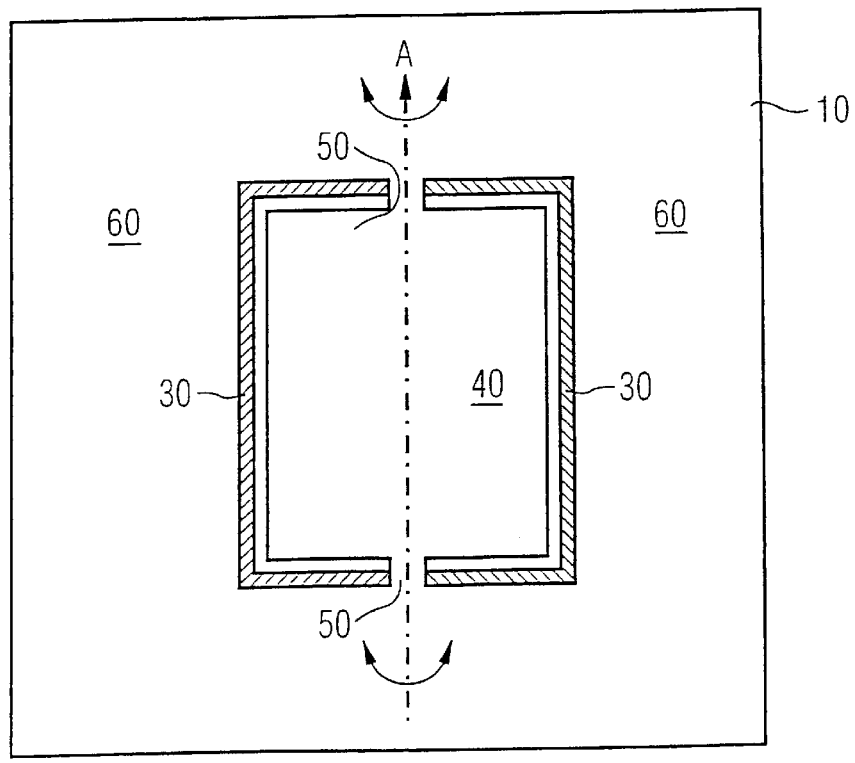
FIG. 3 shows a plan view of the vibrating mirror in the process steps illustrated in FIGS. 1d and 2d, respectively.

According to FIG. 1c, SOI layer 10 is thereupon etched through to insulating layer 20 to produce an island region 40, lying on insulating layer 20, which is joined to region 60 of SOI layer 10 surrounding island region 40 by way of two connecting webs 50 (see FIG. 3). The etching is carried out by a suitable dry-etching method such as plasma trenching after applying a resist coating to the backside cavity region 70. Thus, leaving behind the masked connecting webs 50, the mirror structure with spring suspensions is patterned into the thin silicon of SOI layer 10.

Figure 1D:
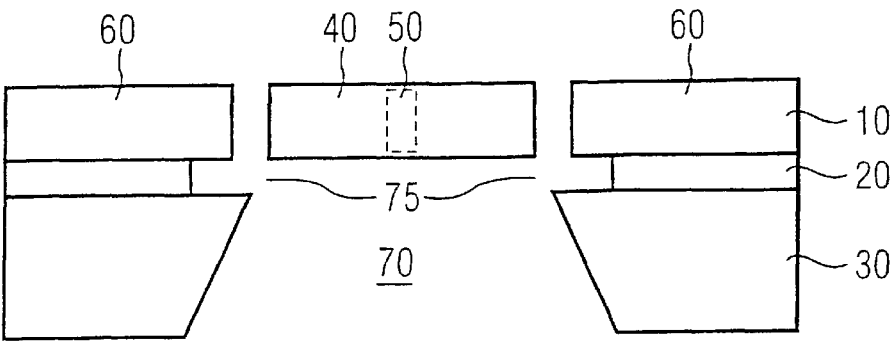
FIG. 1d shows a cross-sectional representation of a fourth process step of the first embodiment.

According to FIG. 1d, due to the etching of insulating layer 20 in the vapor phase, or (floating) by etching using a wet chemical, the mirror structure becomes self-supporting by the formation of removed region 75 of insulating layer 20.

Figure 1E:
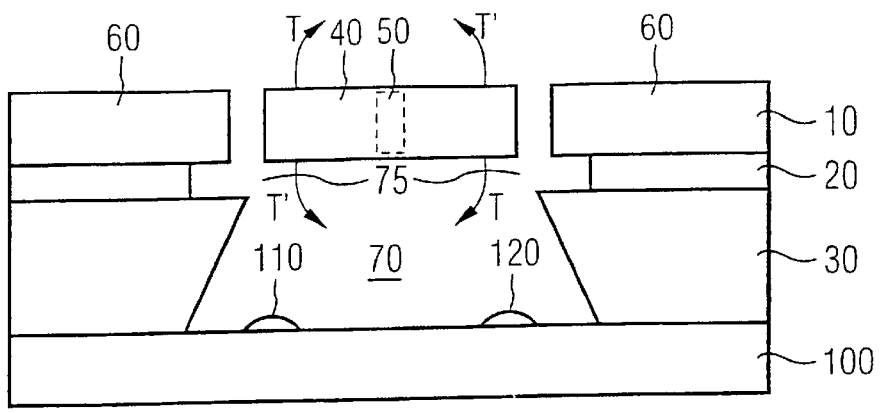
FIG. 1e shows a cross-sectional representation of a fifth process step of the first embodiment.

According to FIG. 1e, to drive the vibrating mirror, suitable electrodes 110 and 120 are applied on the backside on an insulating base 100, and base 100 is bonded or cemented to silicon substrate layer 30. The conductive, highly doped silicon of the vibrating mirror acts as a counter-electrode, so that torsional vibrations are possible in the directions indicated by T and T', the torsional vibrations having such an amplitude that a part of the vibrating mirror extends into the etched-through region 70 of silicon substrate layer 30.

FIGS. 2a–2e show a cross-sectional representation of the process steps according to a second embodiment of the method of the present invention for manufacturing a vibrating mirror.

Figure 2A:
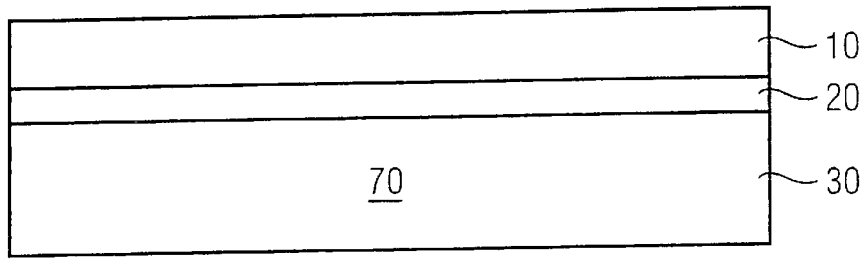
FIG. 2a shows a cross-sectional representation of a first process step of a second embodiment of the method of the present invention for manufacturing the vibrating mirror.

FIG. 2a shows the same representation as FIG. 1a, thus a customary SOI structure.

Figure 2B:
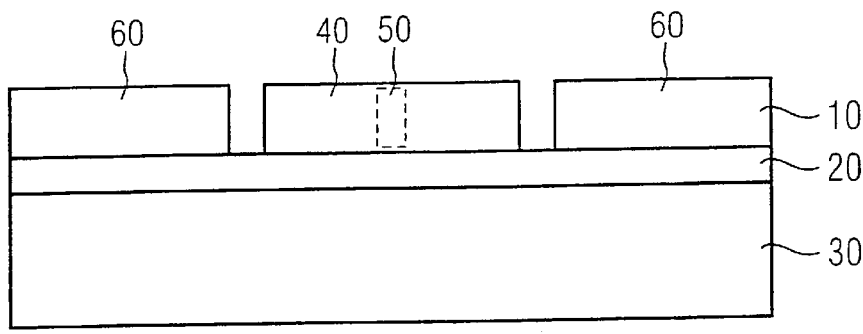
FIG. 2b shows a cross-sectional representation of a second process step of the second embodiment.

In contrast to the first embodiment, according to FIG. 2b, first of all, SOI layer 10 is etched up to insulating layer 20 to produce island region 40 corresponding to the vibrating mirror which is joined by way of the two connecting webs 50 to region 60 of the first layer surrounding island region 40. This is done as in the first embodiment by a suitable dry etching method with high lateral resolution such as plasma trenching.

Figure 2C:
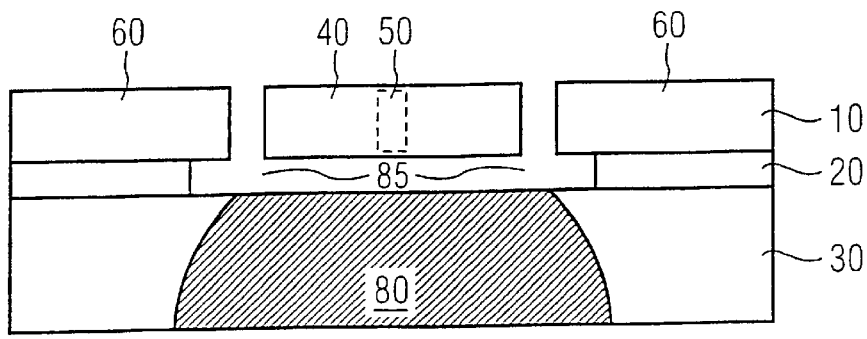
FIG. 2c shows a cross-sectional representation of a third process step of the second embodiment.

According to FIG. 2c, anodization is carried out when working with a back surface that is suitably masked with gold, for example, it being possible to detect an end point by a sudden voltage change in response to the complete anodization of the backside cavity region 80 to be formed. An electrolytic contacting of the highly doped bulk is effected on the cathode side. At the same time, the oxide of intermediate layer 20 is directly passed through in the anodizing electrolyte, e.g., hydrofluoric acid, to form region 85. By suitable selection of the anodizing parameters, the anodization rate can be adjusted to be very much greater than the etching rate of oxide insulation layer 20, resulting in only a small undercut in etching of the surrounding region of upper SOI layer 10.

Figure 2D:
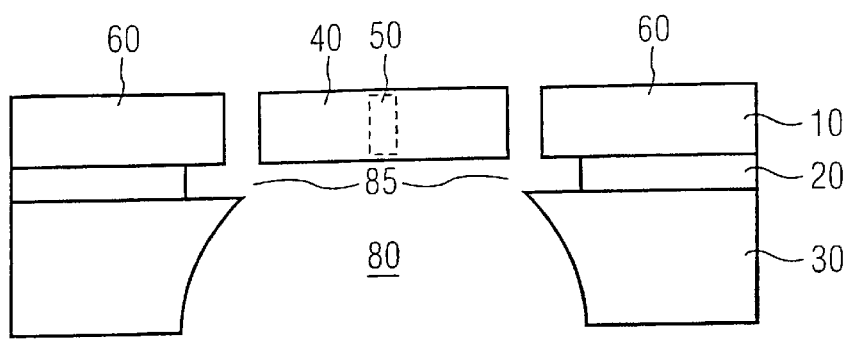
FIG. 2d shows a cross-sectional representation of a fourth process step of the second embodiment.

According to FIG. 2d, the porous silicon in region 80 is thereupon dissolved by $NH_3$, diluted KOH or something similar.

Figure 2E:
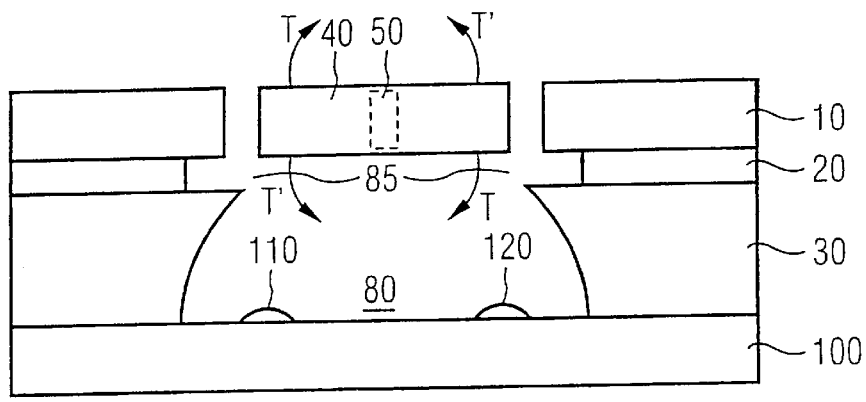
FIG. 2e shows a cross-sectional representation of a fifth process step of the second embodiment.

According to FIG. 2e, analogous to FIG. 1e, suitable counter-electrodes 110, 120 are applied for driving the vibrating mirror. These are provided in an insulated manner on base 100 which, for example, is joined to the SOI structure by cementing or bonding.

FIG. 3 shows a plan view of the vibrating mirror in the process stage of FIG. 1d and FIG. 2d, respectively, the two connecting webs 50 being clearly discernible from this representation as torsion springs which define axis of rotation A for vibrating mirror 40 thus formed.

Although the present invention has been described above in light of example embodiment, it is not limited to these embodiment, but rather can be modified in varied manner.

For example, additional electrodes can be applied on the area of the island region facing the third layer.

The present invention is also not limited to an SOI structure, but is applicable for all common materials of micromechanical devices.

The manufacturing method of the present invention permits the production of micromechanical vibrating mirrors for very large amplitudes, for use in construction (design) lasers, bar code lasers, area monitoring, seat-occupancy detection in motor vehicles, or similar.

A mirror structure was shown in the above exemplary embodiments, but the present invention is also applicable to structures in which the island region is not a mirror element, but another mechanical actuator such as a control element or something similar.

| REFERENCE NUMERAL LIST | |
|---|---|
| 10 | first layer |
| 20 | second layer |
| 30 | third layer |
| 40 | island region |
| 50 | connecting webs |
| 70,80 | backside cavity region |
| 75,85 | removed region of the second layer |
| T, T' | torsional vibration directions |
| 100 | base |
| 110,120 | counter-electrodes |

What is claimed is:

1. A method for manufacturing a micromechanical device, comprising the steps of:
 a) providing a three-layer structure which has a first layer, a second layer and a third layer, the second layer being disposed between the first layer and the third layer;
 b) etching through the first layer to the second layer to form an island region which is disposed on the second layer, the first layer including a first region which surrounds the island region and which joins the island region via at least one connecting web;
 c) etching through a second region, wherein the second region is part of the third layer and extends to the second layer; and
 d) removing a third region, wherein the third region is part of the second layer and disposed below the island region, wherein the removing is for enabling the island region to perform torsional vibrations about the at least one connecting web, the torsional vibrations having an amplitude for enabling a portion of the island region to extend into the second region.

2. The method according to claim 1, wherein step (c) is performed after step (b), and step (d) is performed after step (c).

3. The method according to claim 2, wherein step (c) includes the substep of anisotropic etching a back surface of the third layer.

4. The method according to claim 1, wherein step (a) includes the substep of dry etching the first layer to the second layer.

5. The method according to claim 1, wherein step (b) is performed before step (d), and step (d) is performed before step (c).

6. The method according to claim 5, wherein step (c) includes the substeps of:
 I. anodic etching a back surface of the third layer so as to make at least a portion of the second region porous, and
 II. after substep 1, removing the porous portion.

7. The method according to claim 6, wherein step (d) includes the substep of removing at least a portion of the third region directly in an anodizing electrolyte.

8. The method according to claim 11, further comprising the steps of:
 e) applying counter-electrodes on a base; and
 f) bonding the base to the third layer for enabling the counter-electrodes to lie opposite to the island region.

9. The method according to claim 1, wherein the first layer is a silicon-on-insulator (SOI) layer, the second layer is an insulating layer, and the third layer is a silicon substrate layer.

10. The method according to claim 1, wherein the first layer includes at least one narrow region which remain after step (c), the at least one narrow region forming the at least one connecting web.

11. The method according to claim 1, further comprising the step of:
 h) providing a further region which includes at least one narrow region, the at least one narrow region forming the at least one connecting web.

12. The method according to claim 11, wherein the further region is composed of a metallic material.

13. The method according to claim 1, wherein the micromechanical device includes a micromechanical vibrating-mirror device.

14. The method according to claim 1, wherein step (b) is performed after step (c), and step (d) is performed after step (b).

* * * * *